US012169770B2

United States Patent
Jiang et al.

(10) Patent No.: US 12,169,770 B2
(45) Date of Patent: Dec. 17, 2024

(54) NEURAL NETWORK MODEL COMPRESSION WITH STRUCTURED WEIGHT UNIFICATION

(71) Applicant: TENCENT AMERICA LLC, Palo Alto, CA (US)

(72) Inventors: Wei Jiang, San Jose, CA (US); Wei Wang, Palo Alto, CA (US); Shan Liu, San Jose, CA (US)

(73) Assignee: TENCENT AMERICA LLC, Palo Alto, CA (US)

( * ) Notice: Subject to any disclaimer, the term of this patent is extended or adjusted under 35 U.S.C. 154(b) by 939 days.

(21) Appl. No.: 17/088,061

(22) Filed: Nov. 3, 2020

(65) Prior Publication Data

US 2021/0232891 A1    Jul. 29, 2021

Related U.S. Application Data

(60) Provisional application No. 62/964,996, filed on Jan. 23, 2020.

(51) Int. Cl.
  *G06N 3/04*    (2023.01)
  *G06N 3/084*   (2023.01)
  *H03M 7/30*    (2006.01)

(52) U.S. Cl.
  CPC ............ *G06N 3/04* (2013.01); *G06N 3/084* (2013.01); *H03M 7/70* (2013.01)

(58) Field of Classification Search
  CPC .......... G06N 3/04; G06N 3/084; G06N 3/082; H03M 7/70; H03M 7/3077; H03M 7/3059
  See application file for complete search history.

(56) References Cited

U.S. PATENT DOCUMENTS

| | | | |
|---|---|---|---|
| 2018/0082181 A1* | 3/2018 | Brothers | G06N 3/045 |
| 2018/0107925 A1* | 4/2018 | Choi | G06F 17/16 |
| 2019/0130271 A1* | 5/2019 | Narang | G06N 3/082 |
| 2019/0340492 A1* | 11/2019 | Burger | G06N 3/08 |
| 2020/0143249 A1* | 5/2020 | Georgiadis | G06N 3/045 |
| 2022/0067527 A1* | 3/2022 | Xu | G06N 3/063 |

FOREIGN PATENT DOCUMENTS

WO    2020/014590 A1    1/2020

OTHER PUBLICATIONS

Communication dated Apr. 27, 2022 from the Chinese Patent Office in Chinese Application No. 202110066485.4.

* cited by examiner

*Primary Examiner* — John T Repsher, III
(74) *Attorney, Agent, or Firm* — Sughrue Mion, PLLC

(57) ABSTRACT

A method, computer program, and computer system is provided for compressing a neural network model. One or more indices corresponding to a multi-dimensional tensor associated with a neural network are reordered. A set of weight coefficients associated with the one or more reordered indices is unified. A model of the neural network is compressed based on the unified set of weight coefficients.

20 Claims, 6 Drawing Sheets

NEURAL NETWORK MODEL COMPRESSION WITH STRUCTURED WEIGHT UNIFICATION

CROSS-REFERENCE TO RELATED APPLICATION

This application claims priority from U.S. Provisional Patent Application No. 62/964,996, filed on Jan. 23, 2020, in the U.S. Patent and Trademark Office, which is incorporated herein by reference in its entirety.

FIELD

This disclosure relates generally to field of data processing, and more particularly to neural networks.

BACKGROUND

ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Networks (DNN) in a large range of video applications such as semantic classification, target detection/recognition, target tracking, video quality enhancement, etc. poses a strong need for compressing the DNN models.

SUMMARY

Embodiments relate to a method, system, and computer readable medium for compressing a neural network model. According to one aspect, a method for compressing a neural network model is provided. The method may include reordering one or more indices corresponding to a multi-dimensional tensor associated with a neural network. A set of weight coefficients associated with the one or more reordered indices is unified. A model of the neural network is compressed based on the unified set of weight coefficients.

According to another aspect, a computer system for compressing a neural network model is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include reordering one or more indices corresponding to a multi-dimensional tensor associated with a neural network. A set of weight coefficients associated with the one or more reordered indices is unified. A model of the neural network is compressed based on the unified set of weight coefficients.

According to yet another aspect, a computer readable medium for compressing a neural network model is provided. The computer readable medium may include one or more computer-readable storage devices and program instructions stored on at least one of the one or more tangible storage devices, the program instructions executable by a processor. The program instructions are executable by a processor for performing a method that may accordingly include reordering one or more indices corresponding to a multi-dimensional tensor associated with a neural network. A set of weight coefficients associated with the one or more reordered indices is unified. A model of the neural network is compressed based on the unified set of weight coefficients.

BRIEF DESCRIPTION OF THE DRAWINGS

These and other objects, features and advantages will become apparent from the following detailed description of illustrative embodiments, which is to be read in connection with the accompanying drawings. The various features of the drawings are not to scale as the illustrations are for clarity in facilitating the understanding of one skilled in the art in conjunction with the detailed description. In the drawings.

DETAILED DESCRIPTION

Figure 1:
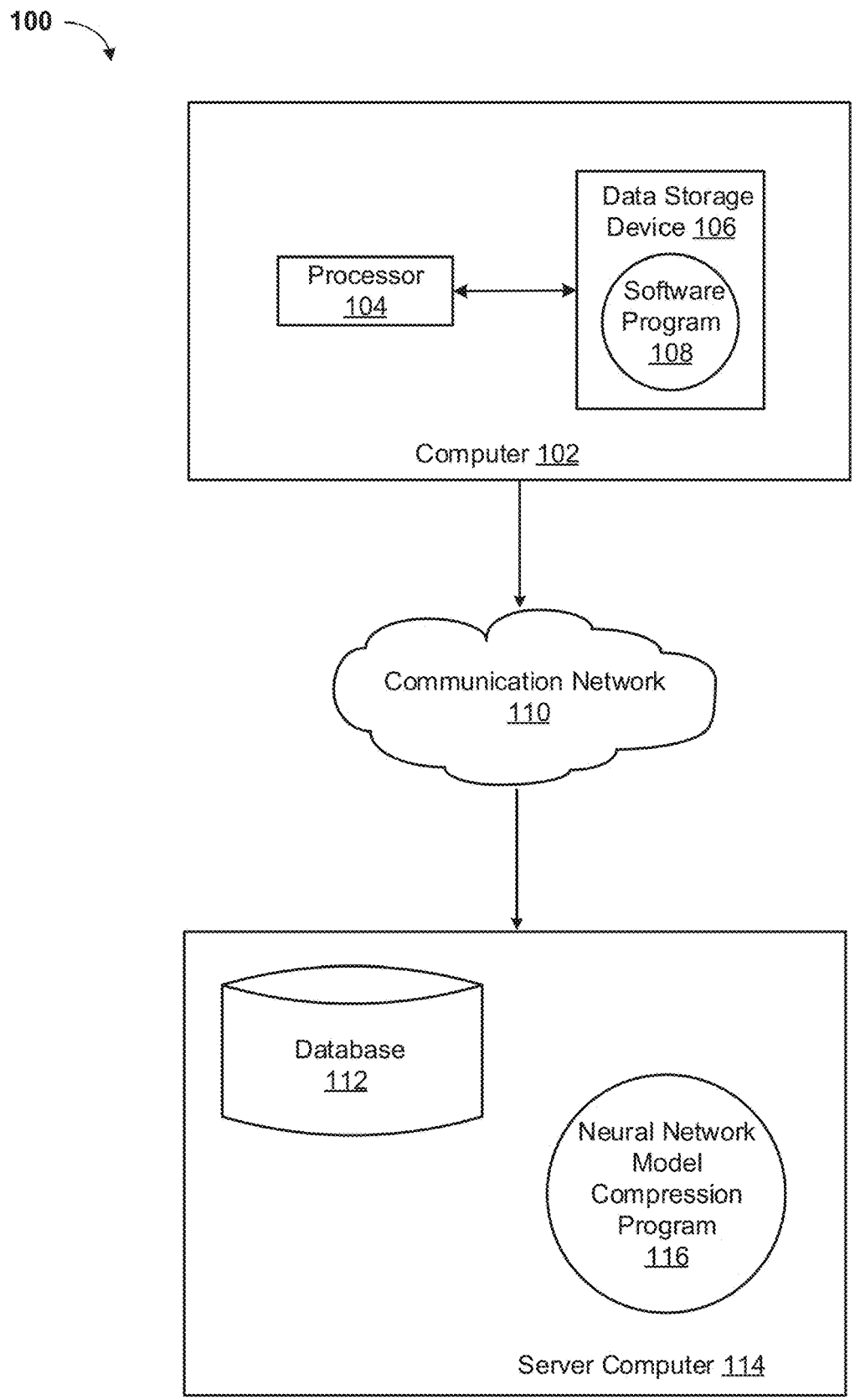
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. Those structures and methods may, however, be embodied in many different forms and should not be construed as limited to the exemplary embodiments set forth herein. Rather, these exemplary embodiments are provided so that this disclosure will be thorough and complete and will fully convey the scope to those skilled in the art. In the description, details of well-known features and techniques may be omitted to avoid unnecessarily obscuring the presented embodiments.

Embodiments relate generally to the field of data processing, and more particularly to neural networks. The following described exemplary embodiments provide a system, method and computer program to, among other things, compress neural network models. Therefore, some embodiments have the capacity to improve the field of computing by allowing for improved compression efficiency of learned weight coefficients, which can significantly reduce a deep neural network model size.

As previously described, ISO/IEC MPEG (JTC 1/SC 29/WG 11) has been actively searching for potential needs for standardization of future video coding technology for visual analysis and understanding. The Compact Descriptors for Visual Search (CDVS) standard was adopted by ISO in 2015 as a still-image standard, which extracts feature representations for image similarity matching. The Compact Descriptors for Visual Analysis (CDVS) standard is listed as Part 15 of MPEG 7 and ISO/IEC 15938-15 and was finalized in 2018, which extracts global and local, hand-designed and DNN-based, feature descriptors for video segments. The success of Deep Neural Network (DNN) in a large range of video applications such as semantic classification, target detection/recognition, target tracking, video quality enhancement, etc. poses a strong need for compressing the DNN models.

MPEG is actively working on the Coded Representation of Neural Network standard (NNR), which encodes DNN models to save both storage and computation. There exist several approaches for learning a compact DNN model. The target is to remove unimportant weight coefficients and the assumption is that the smaller the weight coefficients are in value, the less their importance are. Several network pruning methods have been proposed to explicitly pursue this goal, by adding sparsity-promoting regularization terms into the network training target, or by greedily removing network parameters. From the perspective of compressing DNN models, after learning a compact network model, the weight coefficients can be further compressed by quantization followed by entropy coding. Such further compression processes can significantly reduce the storage size of the DNN model, which are essential for model deployment over mobile devices, chips, etc.

Weight unification regularization may improved compression efficiency in later compression processing. An iterative network retraining/refining framework is used to jointly optimize the original training target and the weight unification loss comprising the compression rate loss, the unification distortion loss, and the computation speed loss, so that the learned network weight coefficients preserves the original target performance, are suitable for further compression, and can speed up computation of using the learned weight coefficients. The proposed method can be applied to compress the original pretrained DNN model. It can also be used as an additional processing module to further compress any pruned DNN model.

The unification regularization may improve the efficiency of further compression of the learned weight coefficients, speeding up computation for using the optimized weight coefficients. This can significantly reduce the DNN model size and speedup the inference computation. Through the iterative retraining process, the performance of the original training target may be maintained, which may allow for compression and computation efficiency. The iterative retraining process also gives the flexibility of introducing different loss at different times, making the system focus on different target during the optimization process. The method, computer system, and computer program disclosed herein can be generally applied to datasets with different data forms. The input/output data are general 4D tensors, which can be real video segments, images, or extracted feature maps.

Aspects are described herein with reference to flowchart illustrations and/or block diagrams of methods, apparatus (systems), and computer readable media according to the various embodiments. It will be understood that each block of the flowchart illustrations and/or block diagrams, and combinations of blocks in the flowchart illustrations and/or block diagrams, can be implemented by computer readable program instructions.

Referring now to FIG. 1, a functional block diagram of a networked computer environment illustrating a neural network models compression system 100 (hereinafter "system") for compressing a neural network model. It should be appreciated that FIG. 1 provides only an illustration of one implementation and does not imply any limitations with regard to the environments in which different embodiments may be implemented. Many modifications to the depicted environments may be made based on design and implementation requirements.

The system 100 may include a computer 102 and a server computer 114. The computer 102 may communicate with the server computer 114 via a communication network 110 (hereinafter "network"). The computer 102 may include a processor 104 and a software program 108 that is stored on a data storage device 106 and is enabled to interface with a user and communicate with the server computer 114. As will be discussed below with reference to FIG. 4 the computer 102 may include internal components 800A and external components 900A, respectively, and the server computer 114 may include internal components 800B and external components 900B, respectively. The computer 102 may be, for example, a mobile device, a telephone, a personal digital assistant, a netbook, a laptop computer, a tablet computer, a desktop computer, or any type of computing devices capable of running a program, accessing a network, and accessing a database.

The server computer 114 may also operate in a cloud computing service model, such as Software as a Service (SaaS), Platform as a Service (PaaS), or Infrastructure as a Service (IaaS), as discussed below with respect to FIGS. 5 and 6. The server computer 114 may also be located in a cloud computing deployment model, such as a private cloud, community cloud, public cloud, or hybrid cloud.

The server computer 114, which may be used for compressing a neural network model is enabled to run a Neural Network Model Compression Program 116 (hereinafter "program") that may interact with a database 112. The neural network model compression program method is explained in more detail below with respect to FIG. 3. In one embodiment, the computer 102 may operate as an input device including a user interface while the program 116 may run primarily on server computer 114. In an alternative embodiment, the program 116 may run primarily on one or more computers 102 while the server computer 114 may be used for processing and storage of data used by the program 116. It should be noted that the program 116 may be a standalone program or may be integrated into a larger neural network model compression program.

It should be noted, however, that processing for the program 116 may, in some instances be shared amongst the computers 102 and the server computers 114 in any ratio. In another embodiment, the program 116 may operate on more than one computer, server computer, or some combination of computers and server computers, for example, a plurality of computers 102 communicating across the network 110 with a single server computer 114. In another embodiment, for example, the program 116 may operate on a plurality of server computers 114 communicating across the network 110 with a plurality of client computers. Alternatively, the program may operate on a network server communicating across the network with a server and a plurality of client computers.

The network 110 may include wired connections, wireless connections, fiber optic connections, or some combination thereof. In general, the network 110 can be any combination of connections and protocols that will support communications between the computer 102 and the server computer 114. The network 110 may include various types of networks, such as, for example, a local area network (LAN), a wide area network (WAN) such as the Internet, a telecommunication network such as the Public Switched Telephone Network (PSTN), a wireless network, a public switched network, a satellite network, a cellular network (e.g., a fifth generation (5G) network, a long-term evolution (LTE) network, a third generation (3G) network, a code division multiple access (CDMA) network, etc.), a public land mobile network (PLMN), a metropolitan area network (MAN), a private network, an ad hoc network, an intranet, a fiber optic-based network, or the like, and/or a combination of these or other types of networks.

The number and arrangement of devices and networks shown in FIG. 1 are provided as an example. In practice, there may be additional devices and/or networks, fewer devices and/or networks, different devices and/or networks, or differently arranged devices and/or networks than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of system 100 may perform one or more functions described as being performed by another set of devices of system 100.

Figure 2:
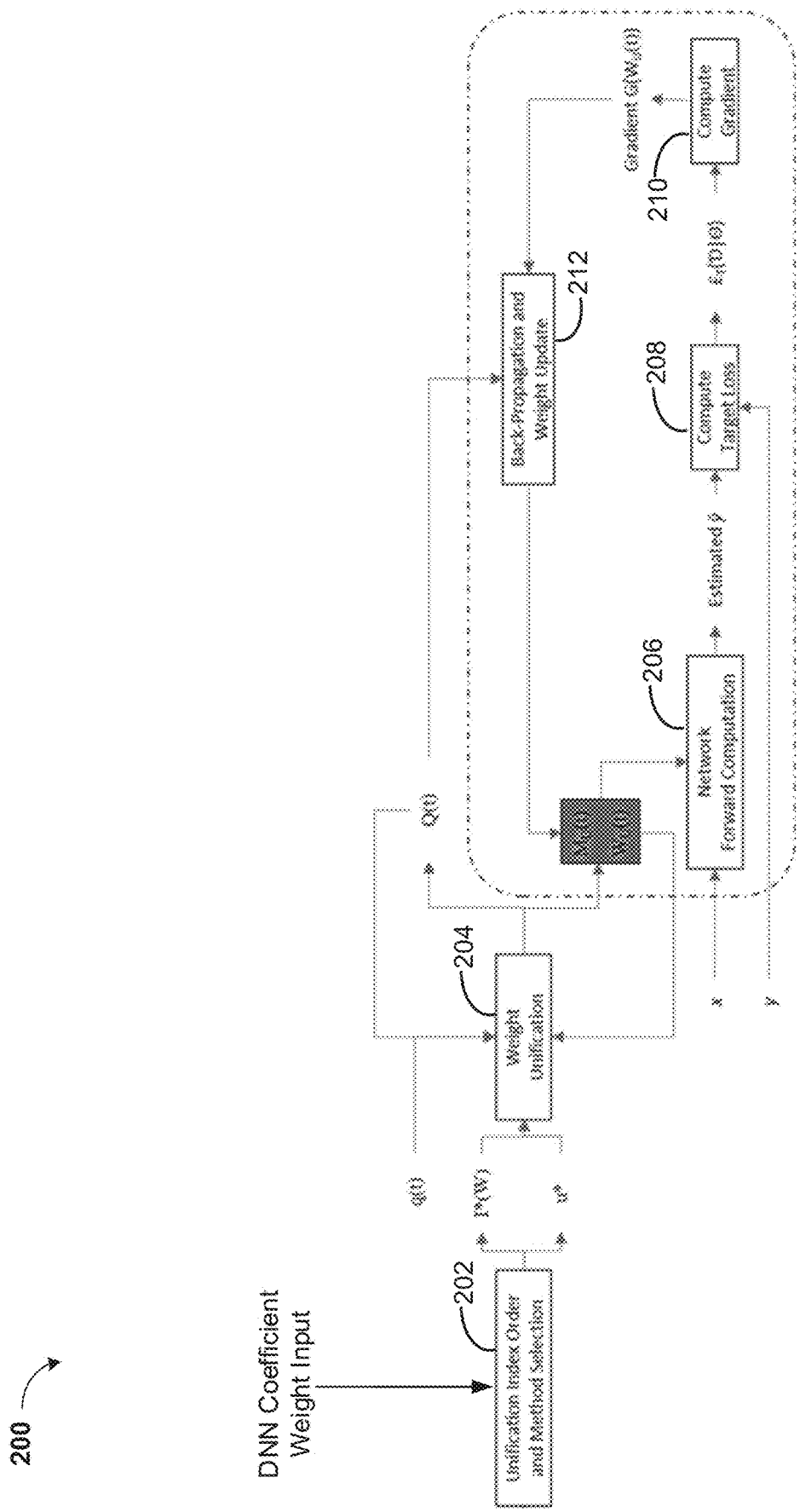
FIG. 2 is a block diagram of a neural network model compression system, according to at least one embodiment.

Referring now to FIG. 2, a neural network model compression system 200 is depicted. The neural network model compression system 200 may be used as a framework of the iterative learning process. The neural network model compression system 200 may include a unification index order and method selection module 202, a weight unification module 204, a network forward computation module 206, a compute target loss module 208, a compute gradient module 210, and a back propagation and weight update module 212.

Let $D=\{(x,y)\}$ denote a data set where a target y is assigned to an input x. Let $\Theta=\{w\}$ denote a set of weight coefficients of a DNN. The target of network training is to learn an optimal set of weight coefficients $\Theta^*$ so that a target loss $\pounds(D|\Theta)$ can be minimized. For example, in previous network pruning approaches, the target loss $\pounds(D|\Theta)$ has two parts, an empirical data loss $\pounds D(D|\Theta)$ and a sparsity-promoting regularization loss $\pounds_R(\Theta)$:

$$\pounds_T(D|\Theta)=\pounds D(D|\Theta)+\lambda_R\pounds_R(\Theta),$$

where $\lambda_R \geq 0$ is a hyperparameter balancing the contributions of the data loss and the regularization loss.

The sparsity-promoting regularization loss places regularization over the entire weight coefficients, and the resulting sparse weights have weak relationship with the inference efficiency or computation acceleration. From another perspective, after pruning, the sparse weights can further go through another network training process where an optimal set of weight coefficients can be learned that can improve the efficiency of further model compression.

This disclosure proposes a weight unification loss $\pounds_U(D|\Theta)$, which is optimized together with the original target loss:

$$\delta(D|\Theta)=\pounds_T(D|\Theta)+\lambda_U\pounds_U(\Theta),$$

where $\lambda_U \geq 0$ is a hyperparameter to balance the contributions of the original training target and the weight unification. By jointly optimizing $\pounds(D|\Theta)$, an optimal set of weight coefficients may be obtained that can largely help the effectiveness of further compression. The weight unification loss takes into consideration the underlying process of how the convolution operation is performed as a GEMM matrix multiplication process, resulting in optimized weight coefficients that can largely accelerate computation. It is worth noting that our weight unification loss can be viewed as an additional regularization term to a general target loss, with (when $\lambda_R > 0$) or without (when $\lambda_R = 0$) general regularizations. Also, our method can be flexibly applied to any regularization loss $\pounds_R(\Theta)$.

In one or more embodiments, the weight unification loss $\pounds_U(\Theta)$ further comprises the compression rate loss $\pounds_C(\Theta)$, the unification distortion loss $\pounds_I(\Theta)$, and the computation speed loss $\pounds_S(\Theta)$:

$$\pounds_U(\Theta)=\pounds_I(\Theta)+\lambda_C\pounds_C(\Theta)+\lambda_S\pounds_S(\Theta),$$

Detailed descriptions of these loss terms are described in later sessions. For both the learning effectiveness and the learning efficiency, an iterative optimization process is further proposed. Parts of the weight coefficients satisfying the desired structure may be fixed. The non-fixed parts of the weight coefficients may be updated by back-propagating the training loss. By iteratively conducting these two steps, more and more weights can be fixed gradually, and the joint loss can be gradually optimized effectively.

Moreover, in one or more embodiments, each layer is compressed individually, $\pounds_U(D|\Theta)$ can be further written as:

$$\pounds_U(\Theta) = \sum_{j=1}^{N} L_U(W^j),$$

where $L_U(W^j)$ is a unification loss defined over the j-th layer; N is the total number of layers where the quantization loss is measured; and $W^j$ denotes the weight coefficients of the j-th layer. Again, since $L_U(W^j)$ is computed for each layer independently, in the rest of the disclosure the script j is omitted without loss of generality.

For each network layer, its weight coefficients W is a general 5-Dimension (5D) tensor with size $(c_i, k_1, k_2, k_3, c_o)$. The input of the layer is a 4-Dimension (4D) tensor A of size $(h_i, w_i, d_i, c_i)$, and the output of the layer is a 4D tensor B of size $(h_o, w_o, d_o, c_o)$. The sizes $c_i, k_1, k_2, k_3, c_o, h_i, w_i, h_o, w_o, d_o$ are integer numbers greater or equal to 1. When any of the sizes $c_i, k_1, k_2, k_3, c_o, h_i, w_i, h_o, w_o, d_o$ takes number 1, the corresponding tensor reduces to a lower dimension. Each item in each tensor is a floating number. Let M denote a 5D binary mask of the same size as W, where each item in M is a binary number 0/1 indicating whether the corresponding weight coefficient is pruned/kept. M is introduced to be associated with W to cope with the case where W is from a pruned DNN model where some connections between neurons in the network are removed from computation. When W is from the original unpruned pretrained model, all items in M take value 1. The output B is computed through the convolution operation $\odot$ based on A, M and W:

$$B_{l',m',n',v} = \sum_{r=1}^{k_1} \sum_{s=1}^{k_2} \sum_{t}^{k_3} \sum_{u=1}^{c_i} M_{u,r,s,t,v} W_{u,r,s,t,v} A_{u,l-\frac{k_1-1}{2}+r,m-\frac{k_2-1}{2}+s,n\frac{k_3-1}{2}+t},$$

$$l = 1, \ldots, h_i, m = 1, \ldots, w_i, n = 1, \ldots, d_i, l' = 1, \ldots, h_0,$$

$$m' = 1, \ldots, w_o, n' = 1, \ldots, d_o, v = 1, \ldots, c_o$$

The parameters $h_i$, $w_i$ and $d_i$ ($h_0$, $w_o$ and $d_o$) are the height, weight and depth of the input tensor A (output tensor B). The parameter $c_i$ ($c_o$) is the number of input (output) channel. The parameters $k_1$, $k_2$ and $k_3$ are the size of the convolution kernel corresponding to the height, weight and depth axes, respectively. That is, for each output channel $v=1, \ldots, c_o$, the operation can be seen as a 4D weight tensor $W_v$ of size $(c_i,k_1,k_2,k_3)$ convolving with the input A.

The order of the summation operation can be changed. The 5D weight tensor is reshaped into a 3D tensor of size $(c_i,c_o,k)$ where $k=k_1 \cdot k_2 \cdot k_3$. The order of reshaped index along the k axis is determined by a reshaping algorithm in a reshaping process, which will be described in detail later.

The desired structure of the weight coefficients may be designed by taking into consideration two aspects. First, the structure of the weight coefficients is aligned with the underlying GEMM matrix multiplication process of how the convolution operation is implemented so that the inference computation of using the learned weight coefficients is accelerated. Second, the structure of the weight coefficients can help to improve the quantization and entropy coding efficiency for further compression. In one or more embodiments, a block-wise structure for the weight coefficients in each layer may be used in the 3D reshaped weight tensor. Specifically, the 3D tensor may be partitioned into blocks of size $(g_i,g_o,g_k)$, and all coefficients within the block may be unified. Unified weights in a block are set to follow a pre-defined unification rule, e.g., all values are set to be the same so that one value can be used to represent the whole block in the quantization process which yields high efficiency. There can be multiple rules of unifying weights, each associated with a unification distortion loss measuring the error introduced by taking this rule. For example, instead of setting the weights to be the same, the weights may be set to have the same absolute value while keeping their original signs. Given this designed structure, during an iteration, the part of the weight coefficients to be fixed may be determined by taking into consideration the unification distortion loss, the estimated compression rate loss, and the estimated speed loss. The neural network training process may be performed to update the remaining un-fixed weight coefficients through the back-propagation mechanism.

The overall framework of the iterative retraining/finetuning process may iteratively alternate steps to optimize the joint loss gradually. Given a pre-trained DNN model with weight coefficients W and mask M, which can be either a pruned sparse model or an un-pruned non-sparse model, in the first step, the order of indices $I(W)=[i_0,\ldots,i_k]$ to reshape the weight coefficients W (and the corresponding mask M) may be determined through the unification index order and method selection module 202, where $k=k_1 \cdot k_2 \cdot k_3$ is the reshaped 3D tensor of weights W. Specifically, the reshaped 3D tensor of weights W may be partitioned into super-blocks of size $(g_i,g_o,g_k)$. Let S denote a super-block. I(W) is determined for each super-block S individually, based on the weight unification loss of the weight coefficients within the super-block S, i.e., based on the weight unification loss $£_T(\Theta)$. The selection of the size of the super-blocks usually depends on the later compression methods. For example, in one or more embodiments, super-blocks of size (64,64,2) may be chosen to be consistent with the 3-Dimension Coding Tree Unit (CTU3D) used by later compression process.

Each super-block S is further partitioned into blocks of size $(d_i,d_o,d_k)$. Weight unification happens inside the blocks. For each super-block S, a weight unifier is used to unify the weight coefficients within the blocks of S. Let b denote a block in S, there can be different ways to unify weight coefficients in b. For example, the weight unifier can set all weights in b to be the same, e.g., the mean of all weights in b. In such a case, the $L_N$ norm of the weight coefficients in b (e.g., $L_2$ norm as variance of weights in b) reflects the unification distortion loss $£_f(b)$ of using the mean to represent the entire block. Also, the weight unifier can set all weights to have the same absolute value, while keeping the original signs. In such a case, the $L_N$ norm of the absolute of weights in b can be used to measure $L_f(b)$. In other words, given a weight unifying method u, the weight unifier can unify weights in b using the method u with an associated unification distortion loss $L_f(u,b)$. The unification distortion loss $£_f(u,S)$ of the entire super-block S may be determined by averaging $L_f(u,b)$ across all blocks in S, i.e., $L_f(u,S)=\text{average}_b(L_f(u,b))$.

Similarly, the compression rate loss $£_C(u,S)$ reflects the compression efficiency of unifying weights in the super-block S using method u. For example, when all weights are set to be the same, only one number is used to represent the whole block, and the compression rate is $r_{compression}=g_i \cdot g_o \cdot g_k$. $£_C(u,S)$ can be defined as $1/r_{compression}$.

The speed loss $£_S(u,S)$ reflects the estimated computation speed of using the unified weight coefficients in S with method u, which is a function of the number of multiplication operation in computation using the unified weight coefficients.

By now, for each possible way of reordering the indices to generate the 3D tensor of weights W, and for each possible method u of unifying weights by the weight unifier, the weight unification loss $£_U(u,S)$ may be computed based on $£_f(u,S)$, $£_C(u,S)$, $\eth_S(u,S)$. The optimal weight unifying method u* and the optimal reordering indices I*(W) can be selected whose combination has the smallest weight unification loss $£_U*(u,S)$. When k is small, the best I*(W) and u* may be exhaustively searched. For large k, other methods can be used to find suboptimal I*(W) and u*. This disclosure does not put any restrictions on the specific ways of determining I*(W) and u*.

Once the order of indices I*(W) and the weight unifying method u* are determined for every super-block S, the target turns to finding a set of updated optimal weight coefficients W* and the corresponding weight mask M* by iteratively minimizing the joint loss described. Specifically, for the t-th iteration, the current weight coefficients W(t−1) and mask M(t−1) may be used. Also, a weight unifying mask Q(t−1) may be maintained throughout the training process. The weight unifying mask Q(t−1) has the same shape as W(t−1), which records whether a corresponding weight coefficient is unified or not. Then, a unified weight coefficients $W_U(t-1)$ and a new unifying mask Q(t−1) are computed through the weight unification module 204. In the weight unification module 204, the weight coefficients in S may be reordered according to the determined order of index I*(W), and the super-blocks may be ranked based on their unification loss $£_U(u*,S)$ in ascending order. Given a hyperparameter q, the top q super-blocks are selected to be unified. And the weight unifier unifies the blocks in the selected super-blocks S using the corresponding determined method u*, resulting a unified weight $W_U(t-1)$ and weight mask $M_U(t-1)$. The corresponding entry in the unifying mask Q(t−1) is marked as being unified. In one or more embodiments, $M_U(t-1)$ is different from M(t−1), where for a block having both pruned and unpruned weight coefficients, the originally pruned weight coefficients will be set to have a non-zero value again by the weight unifier, and the corresponding item in $M_U(t-1)$ will be changed. For other types of blocks, $M_U(t-1)$ will naturally remain unchanged.

The weight coefficients which are marked in Q(t−1) as being unified may be fixed, and the remaining unfixed weight coefficients of W(t−1) may be updated through a neural network training process, resulting in updated W(t) and M(t).

Let $\mathcal{D} = \{(x,y)\}$ denote a training dataset, where $\mathcal{D}$ can be the same as the original dataset $\mathcal{D}_0 = \{(x_0, y_0)\}$ based on which the pre-trained weight coefficients $W$ are obtained. $\mathcal{D}$ can also be a different dataset from $\mathcal{D}_0$, but with the same data distribution as the original dataset $\mathcal{D}$. In the second step, each input x is passed though the current network via the network forward computation module 206 using the current weight coefficients $W_U(t-1)$ and mask $M_U(t-1)$, which generates an estimated output $\bar{y}$. Based on the ground-truth annotation y and the estimated output $\bar{y}$, the target training loss $\mathcal{L}_T(\mathcal{D}|\Theta)$ can be computed through the compute target loss module 208. Then the gradient of the target loss $G(W_U(t-1))$ can be computed by the calculate gradient module 210. The automatic gradient computing method used by deep learning frameworks such as tensorflow or pytorch can be used to compute $G(W_U(t-1))$. Based on the gradient $G(W_U(t-1))$ and the unifying mask $Q(t-1)$, the non-fixed weight coefficients of $W_U(t-1)$ and the corresponding mask $M_U(t-1)$ can be updated through back-propagation using the back propagation and weight update module 212. The retraining process may be an iterative process. Typically multiple iterations are taken to update the non-fixed parts of $W_U(t-1)$ and the corresponding $M(t-1)$, e.g., until the target loss converges. Then the system goes to the next iteration t, where given a new hyperparameter q(t), based on $W_U(t-1)$, $u^*$ and $I^*(W)$, a new unified weight coefficients $W_U(t)$, mask $M_U(t)$, and the corresponding unifying mask $Q(t)$ can be computed through the Weight Unification process.

In one or more embodiments, the hyperparameter q(t) increases its value during each iteration as t increases, so that more and more weight coefficients will be unified and fixed throughout the entire iterative learning process.

Figure 3:
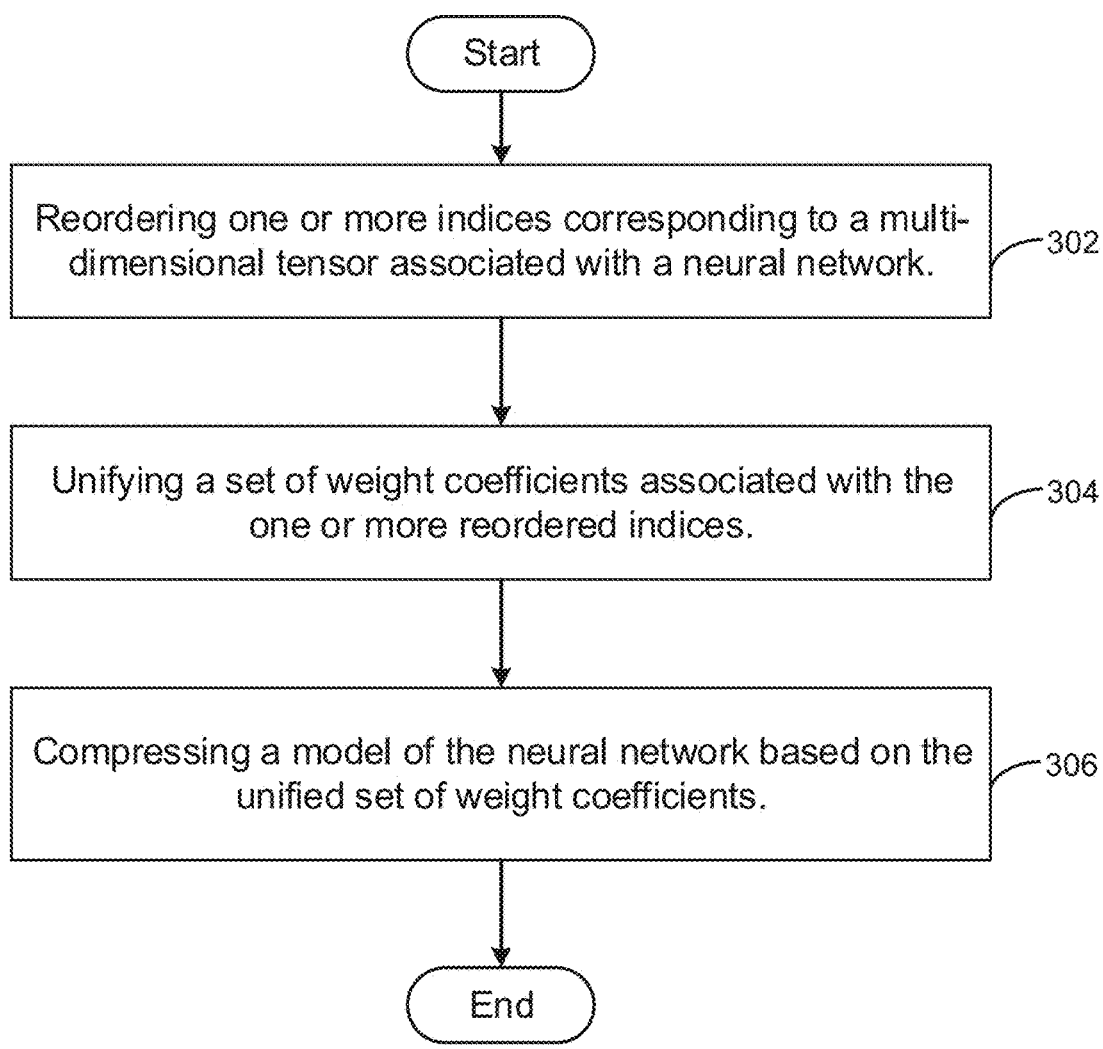
FIG. 3 is an operational flowchart illustrating the steps carried out by a program that compresses neural network models, according to at least one embodiment.

Referring now to FIG. 3, an operational flowchart illustrating the steps of a method 300 for compressing a neural network model is depicted. In some implementations, one or more process blocks of FIG. 3 may be performed by the computer 102 (FIG. 1) and the server computer 114 (FIG. 1). In some implementations, one or more process blocks of FIG. 3 may be performed by another device or a group of devices separate from or including the computer 102 and the server computer 114.

At 302, the method 300 includes reordering one or more indices corresponding to a multi-dimensional tensor associated with a neural network.

At 304, the method 300 includes unifying a set of weight coefficients associated with the one or more reordered indices.

At 306, the method 300 includes compressing a model of the neural network based on the unified set of weight coefficients.

It may be appreciated that FIG. 3 provides only an illustration of one implementation and does not imply any limitations with regard to how different embodiments may be implemented. Many modifications to the depicted environments may be made based on design and implementation requirements.

Figure 4:
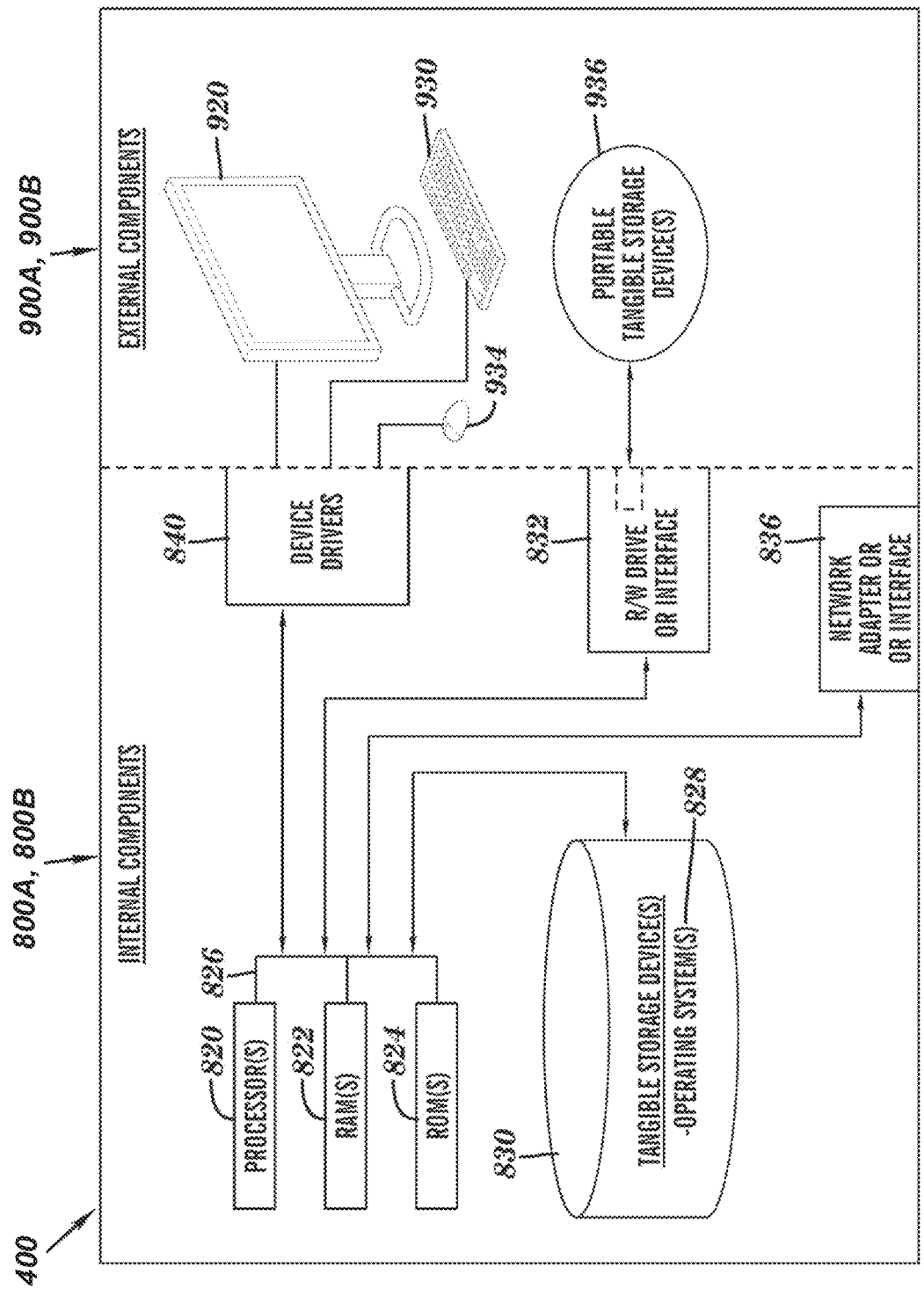
FIG. 4 is a block diagram of internal and external components of computers and servers depicted in FIG. 1 according to at least one embodiment.

FIG. 4 is a block diagram 400 of internal and external components of computers depicted in FIG. 1 in accordance with an illustrative embodiment. It should be appreciated that FIG. 4 provides only an illustration of one implementation and does not imply any limitations with regard to the environments in which different embodiments may be implemented. Many modifications to the depicted environments may be made based on design and implementation requirements.

Computer 102 (FIG. 1) and server computer 114 (FIG. 1) may include respective sets of internal components 800A,B and external components 900A,B illustrated in FIG. 4. Each of the sets of internal components 800 include one or more processors 820, one or more computer-readable RAMs 822 and one or more computer-readable ROMs 824 on one or more buses 826, one or more operating systems 828, and one or more computer-readable tangible storage devices 830.

Processor 820 is implemented in hardware, firmware, or a combination of hardware and software. Processor 820 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. In some implementations, processor 820 includes one or more processors capable of being programmed to perform a function. Bus 826 includes a component that permits communication among the internal components 800A,B.

The one or more operating systems 828, the software program 108 (FIG. 1) and the Neural Network Model Compression Program 116 (FIG. 1) on server computer 114 (FIG. 1) are stored on one or more of the respective computer-readable tangible storage devices 830 for execution by one or more of the respective processors 820 via one or more of the respective RAMs 822 (which typically include cache memory). In the embodiment illustrated in FIG. 4, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory, an optical disk, a magneto-optic disk, a solid state disk, a compact disc (CD), a digital versatile disc (DVD), a floppy disk, a cartridge, a magnetic tape, and/or another type of non-transitory computer-readable tangible storage device that can store a computer program and digital information.

Each set of internal components 800A,B also includes a R/W drive or interface 832 to read from and write to one or more portable computer-readable tangible storage devices 936 such as a CD-ROM, DVD, memory stick, magnetic tape, magnetic disk, optical disk or semiconductor storage device. A software program, such as the software program 108 (FIG. 1) and the Neural Network Model Compression Program 116 (FIG. 1) can be stored on one or more of the respective portable computer-readable tangible storage devices 936, read via the respective R/W drive or interface 832 and loaded into the respective hard drive 830.

Each set of internal components 800A,B also includes network adapters or interfaces 836 such as a TCP/IP adapter cards; wireless Wi-Fi interface cards; or 3G, 4G, or 5G wireless interface cards or other wired or wireless communication links. The software program 108 (FIG. 1) and the Neural Network Model Compression Program 116 (FIG. 1) on the server computer 114 (FIG. 1) can be downloaded to the computer 102 (FIG. 1) and server computer 114 from an external computer via a network (for example, the Internet, a local area network or other, wide area network) and respective network adapters or interfaces 836. From the network adapters or interfaces 836, the software program 108 and the Neural Network Model Compression Program 116 on the server computer 114 are loaded into the respective hard drive 830. The network may comprise copper wires, optical fibers, wireless transmission, routers, firewalls, switches, gateway computers and/or edge servers.

Each of the sets of external components 900A,B can include a computer display monitor 920, a keyboard 930, and a computer mouse 934. External components 900A,B can also include touch screens, virtual keyboards, touch pads, pointing devices, and other human interface devices. Each of the sets of internal components 800A,B also includes device drivers 840 to interface to computer display monitor 920, keyboard 930 and computer mouse 934. The device drivers 840, R/W drive or interface 832 and network adapter or interface 836 comprise hardware and software (stored in storage device 830 and/or ROM 824).

It is understood in advance that although this disclosure includes a detailed description on cloud computing, implementation of the teachings recited herein are not limited to a cloud computing environment. Rather, some embodiments are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
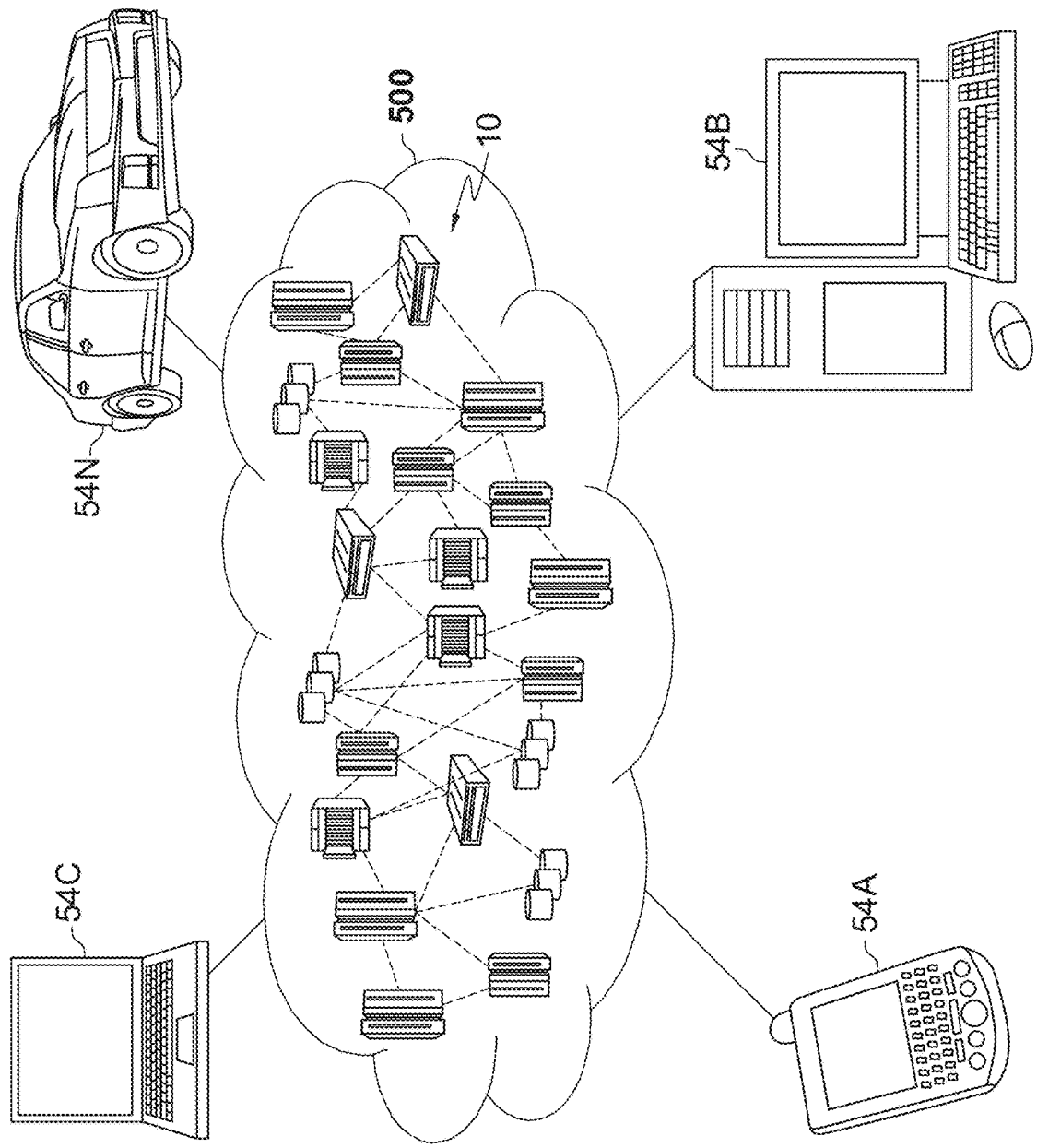
FIG. 5 is a block diagram of an illustrative cloud computing environment including the computer system depicted in FIG. 1, according to at least one embodiment.

Referring to FIG. 5, illustrative cloud computing environment 500 is depicted. As shown, cloud computing environment 500 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Cloud computing nodes 10 may communicate with one another. They may be grouped (not shown) physically or virtually, in one or more networks, such as Private, Community, Public, or Hybrid clouds as described hereinabove, or a combination thereof. This allows cloud computing environment 500 to offer infrastructure, platforms and/or software as services for which a cloud consumer does not need to maintain resources on a local computing device. It is understood that the types of computing devices 54A-N shown in FIG. 5 are intended to be illustrative only and that cloud computing nodes 10 and cloud computing environment 500 can communicate with any type of computerized device over any type of network and/or network addressable connection (e.g., using a web browser).

Figure 6:
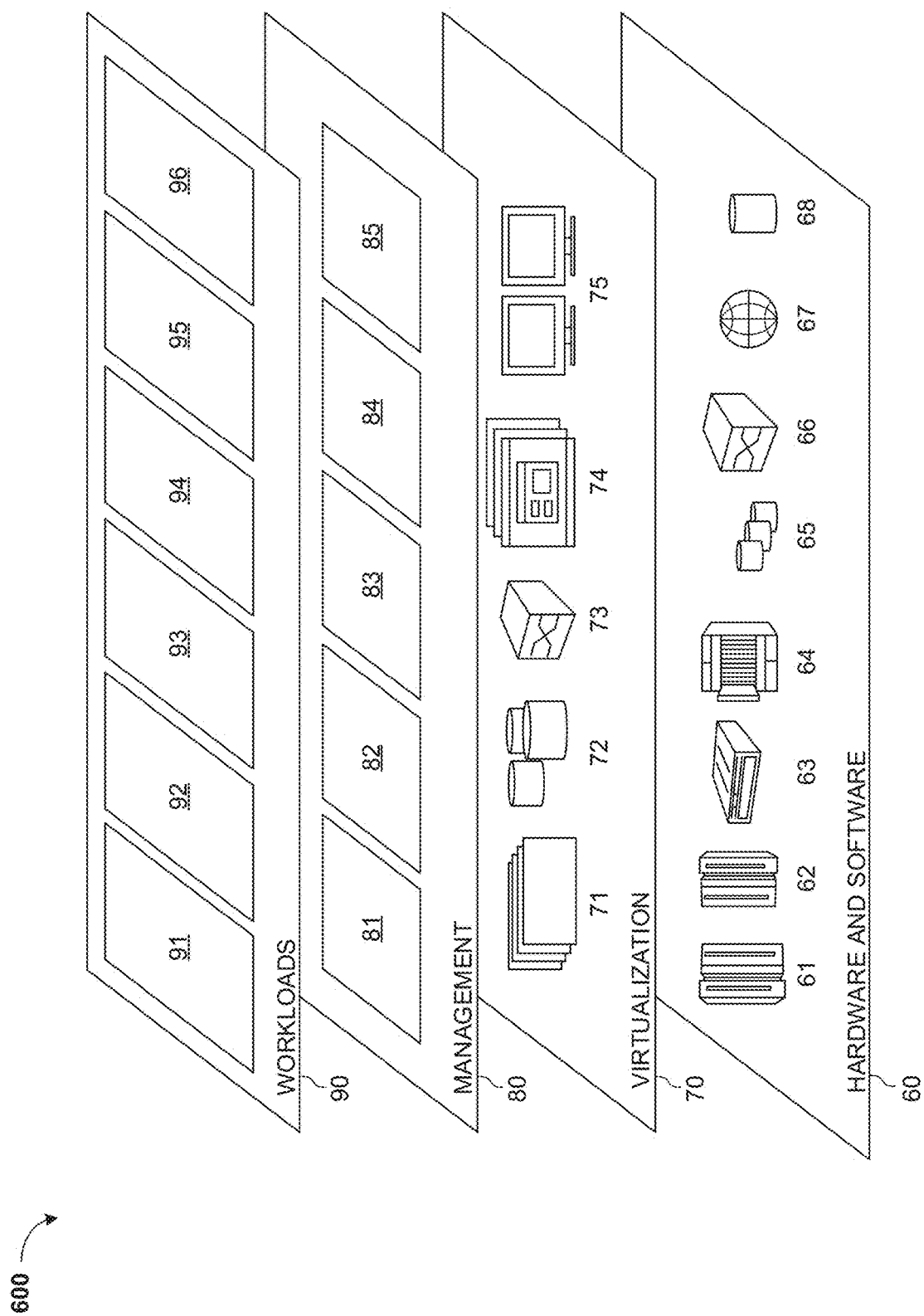
FIG. 6 is a block diagram of functional layers of the illustrative cloud computing environment of FIG. 5, according to at least one embodiment.

Referring to FIG. 6, a set of functional abstraction layers 600 provided by cloud computing environment 500 (FIG. 5) is shown. It should be understood in advance that the components, layers, and functions shown in FIG. 6 are intended to be illustrative only and embodiments are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and Neural Network Model Compression 96. Neural Network Model Compression 96 may compress a neural network model.

Some embodiments may relate to a system, a method, and/or a computer readable medium at any possible technical detail level of integration. The computer readable medium may include a computer-readable non-transitory storage medium (or media) having computer readable program instructions thereon for causing a processor to carry out operations.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program code/instructions for carrying out operations may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects or operations.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer readable media according to various embodiments. In this regard, each block in the flowchart or block diagrams may represent a module, segment, or portion of instructions, which comprises one or more executable instructions for implementing the specified logical function(s). The method, computer system, and computer readable medium may include additional blocks, fewer blocks, different blocks, or differently arranged blocks than those depicted in the Figures. In some alternative implementations, the functions noted in the blocks may occur out of the order noted in the Figures. For example, two blocks shown in succession may, in fact, be executed concurrently or substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware may be designed to implement the systems and/or methods based on the description herein.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

The descriptions of the various aspects and embodiments have been presented for purposes of illustration, but are not intended to be exhaustive or limited to the embodiments disclosed. Even though combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for compressing a neural network model, executable by a processor, comprising:

for a layer in a neural network model comprising a plurality of layers, reshaping weight coefficients corresponding to a block in a multi-dimensional tensor associated with a neural network, wherein the block is a part of a super-block in the in the multi-dimensional tensor;

for the layer, unifying a set of weight coefficients associated with the one or more reordered indices corresponding to the block using:

$$\pounds_U(W) = \sum_{j=1}^{N} L_U(W^j)$$

wherein $W^j$ is the set of weight coefficients of a j-th layer; $L_U(W^j)$ is a unification loss of the j-th layer; and N is a total number of layers in the neural network model; and compressing a model of the neural network based on the unified set of weight coefficients.

2. The method of claim 1, wherein unifying the set of weight coefficients comprises:

quantizing weight coefficients; and selecting the weight coefficients based on minimizing the unification loss value associated with the weight coefficients.

3. The method of claim 2, further comprising training the neural network based on back-propagating the minimized unification loss value.

4. The method of claim 2, wherein one or more weight coefficients from among the weight coefficients are fixed to one or more values based on back-propagating the minimized unification loss value.

5. The method of claim 4, further comprising updating one or more non-fixed weight coefficients from among the weight coefficients based on determining a gradient and a unifying mask associated with the set of weight coefficients.

6. The method of claim 1, further comprising compressing the set of weight coefficients by quantizing and entropy-coding the weight coefficients.

7. The method of claim 1, wherein the unified set of weight coefficients comprises one or more weight coefficients having a same absolute value.

8. A computer system for compressing a neural network model, the computer system comprising:

one or more computer-readable non-transitory storage media configured to store computer program code; and one or more computer processors configured to access said computer program code and operate as instructed by said computer program code, said computer program code including:

reordering code configured to cause the one or more computer processors to reshape, for a layer in a neural network model comprising a plurality of layers, weight coefficients corresponding to a block in a multi-dimensional tensor associated with a neural network, wherein the block is a part of a super-block in the in the multi-dimensional tensor;

unifying code configured to cause the one or more computer processors to unify, for the layer, a set of weight coefficients associated with the one or more reordered indices corresponding to the block using:

$$\pounds_U(W) = \sum\nolimits_{j=1}^{N} L_U(W^j)$$

wherein $W^j$ is the set of weight coefficients of a j-th layer; $L_U(W^j)$ is a unification loss of the j-th layer; and N is a total number of layers in the neural network model; and first compressing code configured to cause the one or more computer processors to compress a model of the neural network based on the unified set of weight coefficients.

9. The computer system of claim 8, wherein the unifying code comprises:

quantizing code configured to cause the one or more computer processors to quantize weight coefficients; and selecting code configured to cause the one or more computer processors to select the weight coefficients based on minimizing the unification loss value associated with the weight coefficients.

10. The computer system of claim 9, further comprising training code configured to cause the one or more computer processors to train the neural network based on back-propagating the minimized unification loss value.

11. The computer system of claim 9, wherein one or more weight coefficients from among the weight coefficients are fixed to one or more values based on back-propagating the minimized unification loss value.

12. The computer system of claim 11, further comprising updating code configured to cause the one or more computer processors to update one or more non-fixed weight coefficients from among the weight coefficients based on determining a gradient and a unifying mask associated with the set of weight coefficients.

13. The computer system of claim 8, further comprising second compressing code configured to cause the one or more computer processors to compress the set of weight coefficients by quantizing and entropy-coding the weight coefficients.

14. The computer system of claim 8, wherein the unified set of weight coefficients comprises one or more weight coefficients having a same absolute value.

15. A non-transitory computer readable medium having stored thereon a computer program for compressing a neural network model, the computer program configured to cause one or more computer processors to:

for a layer in a neural network model comprising a plurality of layers, reshape weight coefficients corresponding to a block in a multi-dimensional tensor associated with a neural network, wherein the block is a part of a super-block in the in the multi-dimensional tensor;

for the layer, unify a set of weight coefficients associated with the one or more reordered indices corresponding to the block using:

$$\pounds_U(W) = \sum\nolimits_{j=1}^{N} L_U(W^j)$$

wherein $W^j$ is the set of weight coefficients of a j-th layer; $L_U(W^j)$ is a unification loss of the j-th layer; and N is a total number of layers in the neural network model; and compress a model of the neural network based on the unified set of weight coefficients.

16. The computer readable medium of claim 15, wherein the computer program is further configured to cause one or more computer processors to:

quantizing code configured to cause the one or more computer processors to quantize weight coefficients; and selecting code configured to cause the one or more computer processors to select the weight coefficients based on minimizing the unification loss value associated with the weight coefficients.

17. The computer readable medium of claim 16, wherein the computer program is further configured to cause one or more computer processors to train the neural network based on back-propagating the minimized unification loss value.

18. The computer readable medium of claim 16, wherein one or more weight coefficients from among the weight coefficients are fixed to one or more values based on back-propagating the minimized unification loss value.

19. The computer readable medium of claim 18, wherein the computer program is further configured to cause one or more computer processors to update one or more non-fixed weight coefficients from among the weight coefficients based on determining a gradient and a unifying mask associated with the set of weight coefficients.

20. The computer readable medium of claim 15, wherein the computer program is further configured to cause one or more computer processors to compress the set of weight coefficients by quantizing and entropy-coding the weight coefficients.

* * * * *